United States Patent

Ravanelli

Patent Number: 6,064,556
Date of Patent: May 16, 2000

[54] PROTECTION CIRCUIT FOR AN ELECTRIC PULSE SUPPLY LINE IN A SEMICONDUCTOR INTEGRATED DEVICE

[75] Inventor: Enrico M. A. Ravanelli, Monza, Italy

[73] Assignee: STMicroelectronics S.r.l., Agrate Brianza, Italy

[21] Appl. No.: 09/163,941

[22] Filed: Sep. 30, 1998

[30] Foreign Application Priority Data

Sep. 30, 1997 [EP] European Pat. Off. ............. 97830485

[51] Int. Cl.[7] ....................................................... H02H 3/22
[52] U.S. Cl. ......................... 361/111; 361/56; 361/91.3; 361/91.5
[58] Field of Search ................... 361/56, 111, 91.1–91.3, 361/91.5

[56] References Cited

U.S. PATENT DOCUMENTS

| | | | |
|---|---|---|---|
| 4,630,162 | 12/1986 | Bell et al. | 361/56 |
| 5,852,541 | 12/1998 | Lin et al. | 361/111 |

FOREIGN PATENT DOCUMENTS 0 435 047 A2  7/1991  European Pat. Off. .

WO 96/18240  6/1996  WIPO .

OTHER PUBLICATIONS

European Search Report dated Feb. 19, 1998 with annex on European Application No. 97 830485.

*Primary Examiner*—Michael J. Sherry
*Attorney, Agent, or Firm*—Gunster, Yoakley, Valdes-Fauli & Stewart, P.A.; Theodore E. Galanthay

[57] ABSTRACT

A protection circuit for a pulse type power supply line of an integrated circuit device. The protection circuit includes a switching circuit having a preset delay, and a first transistor that is connected between the pulse power supply line and ground. The gate terminal of the first transistor is coupled to ground through a first resistor, and to a second power supply line for a low DC voltage through the switching circuit. In a preferred embodiment, the switching circuit includes a second transistor that is connected between the gate terminal of the first transistor and ground. The gate terminal of the second transistor is coupled to the second power supply line through a current generator, and is also coupled to ground through a resistive element and a capacitive element that are connected in parallel.

17 Claims, 2 Drawing Sheets

2

PROTECTION CIRCUIT FOR AN ELECTRIC PULSE SUPPLY LINE IN A SEMICONDUCTOR INTEGRATED DEVICE

CROSS-REFERENCE TO RELATED APPLICATIONS

This application is based upon and claims priority from prior European Patent Application No. 97-830485.5, filed on Sep. 30, 1997, the entire disclosure of which is herein incorporated by reference.

BACKGROUND OF THE INVENTION

1. Field of the Invention

The present invention relates to protection circuits for the terminals of an integrated circuit device, and more specifically to a protection circuit for a terminal of a power supply line of the pulse type.

2. Description of Related Art

Conventional MOS integrated circuits, and in general low voltage supply portions of mixed technology integrated devices, can suffer serious damage from electrostatic discharges (ESDs) to any device terminal. It has been recognized that the terminals of an integrated circuit device are likely to incidentally contact electrically-charged objects during both fabrication and mounting to a circuit assembly. Such a contact can introduce an ESD and create potential differences of considerable magnitude between the semiconductor substrate of the integrated circuit and the gate electrodes of the input transistors or the drain regions of the output transistors.

With respect to an input transistor, if the potential difference exceeds the dielectric strength threshold of the gate insulation, the transistor is made unusable by the ESD that breaks down the gate insulation. A similar destructive effect occurs in an output transistor if the potential difference exceeds the reverse breakdown threshold of the drain junction. As an example, a CMOS integrated circuit fabricated with 1.2 $\mu$m technology (i.e., with minimum gate dimensions of 1.2 $\mu$m), has a breakdown voltage of approximately 12–14V for input transistors and approximately 12V for output transistors.

There are several conventional ways for protecting the input, output, and supply terminals of an integrated circuit from electrostatic discharges. Generally, protectors using lateral bipolar transistors are used for this purpose. One example of a conventional protection device that is specially adapted for monolithic integration to a MOS-type integrated circuit is described in Italian Patent Application No. 26063 A/80 by the present applicant. The disclosed device has a lateral NPN transistor whose emitter and collector are doped with N-type impurities simultaneously and identically with the source and drain regions of the IGFETs in the MOS circuit to be protected. The base of the NPN transistor is made inaccessible and is heavily and deeply doped with acceptor ions (i.e., P-type impurities) through ion implantation.

An improved version of this protection structure is disclosed in Italian Patent Application No. 23077 A/85 by the present applicant. The protection circuit includes two lateral bipolar transistors that have both emitter terminals connected to a ground terminal, one collector terminal connected to the input terminal of the circuit, and another collector terminal connected to the gate terminals of the IGFETs. A diffused resistor R' interconnects the collectors of the two lateral transistors. Further, the base width of the first transistor and the impurity concentration in the bases of both transistors are selected so as to hold the negative resistance phenomena trigger voltage of the first transistor and the breakdown voltage of the second transistor at a lower value than the breakdown voltage of the gate isolation oxides and the bipolar junctions of the elements in the integrated circuit. Further, these values are chosen so as to hold the sustaining voltage of the first transistor at a higher value than the integrated circuit supply voltage.

Another simple, yet effective conventional ESD protection circuit is formed by a bipolar transistor connected between an integrated circuit terminal and ground. The base and emitter of the transistor are short circuited so that the transistor exhibits a current/voltage characteristic of the bistable type between a high-impedance, high-voltage state (designated BVcbo in the pertinent art) and a low-impedance, low-voltage state (designated BVcer). The transistor operates in the high-impedance, high-voltage mode during normal circuit operation without affecting the circuit. On the occurrence of an ESD, the transistor is forced into the low-impedance, low-voltage mode and thus opens a path to ground for the ESD pulse.

The effectiveness of protectors employing bipolar transistors is much lower in protecting a supply terminal or line. In fact, the BVcbo and BVcer may have statistic process variations that cause inconsistent actual values for a terminal or line that is at the maximum potential provided in the integrated circuit. Additionally, voltage noise on a supply line can accidentally turn on the bipolar protection transistor and clamp the supply voltage on BVcer, which is usually much lower than the voltage needed to power the circuit. This can cause a circuit malfunction and can even cause permanent damage when a large DC current flows through the circuit.

An ESD protection circuit for use on a power supply terminal or line is disclosed in European Patent Application No. 96-830664.7 by the present applicant. As shown in FIG. 1, the disclosed protection circuit includes a first field-effect transistor M1 whose drain terminal is connected to the supply line Vdd and whose gate and source terminals are connected to ground GND through first and second resistors R1 and R2, respectively. Additionally, a second field-effect transistor M2 is connected between ground and the supply line, with the gate terminal of the second transistor M2 connected to the source terminal of the first transistor M1. A capacitor C is optionally connected between the gate terminal and the drain terminal of the first transistor M1. In the absence of the capacitor, the protective function is ensured by the intrinsic capacitance between the gate and the drain of the first transistor.

The protection circuit of FIG. 1 provides a dynamic circuit that becomes activated only by transient conditions and that reveals no dangerous latch-up side actions. However, if a pulse-type power supply (i.e., chopper-type power supply) is used, the conventional protection circuits described above cannot provide effective protection for the supply line whenever the switching transistors of the supply have comparable rates (d voltage/d time) to the electrostatic discharge transients. In particular, the conventional protection circuits fail to detect electrical transients that coincidentally happen to be similar to those from the switching transistors. Thus, the circuit can malfunction and possibly even be damaged.

SUMMARY OF THE INVENTION

In view of these drawbacks, it is an object of the present invention to remove the above-mentioned drawbacks and to provide effective, active protection against electrostatic discharges for pulse-type power supply line terminals of an integrated circuit. A protection circuit provides electrostatic discharge protection for a pulse-type power supply line or terminal. The protection circuit actively disables protection while the device is under power during normal operation, and enables active protection while the device is being handled and thus, not under power.

An embodiment of the present invention provides a protection circuit for a pulse type power supply line of an integrated circuit device. The protection circuit includes a switching circuit having a preset delay, and a first transistor that is connected between the pulse power supply line and ground. The gate terminal of the first transistor is coupled to ground through a first resistor, and to a second power supply line for a low DC voltage through the switching circuit. In one preferred embodiment, the switching circuit includes a second transistor that is connected between the gate terminal of the first transistor and ground. The gate terminal of the second transistor is coupled to the second power supply line through a current generator, and is also coupled to ground through a resistive element and a capacitive element that are connected in parallel.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

A pulse state (or chopper-type) power supply is usually employed in integrated circuit devices to provide power to power stages of the device because such supplies offer high efficiency combined with low power dissipation. In general, the maximum value of the pulse supply voltage VDD in such devices is relatively high. For this reason, the typical device also has a second supply line LV RAIL for powering circuitry serving control functions (e.g., CMOS circuitry in mixed technology integrated circuit devices). The second dedicated supply line is at a voltage LV (relative to ground GND) that is relatively low and constant, and is protected against ESD (e.g., by one of the conventional protection circuits described above).

Figure 2:
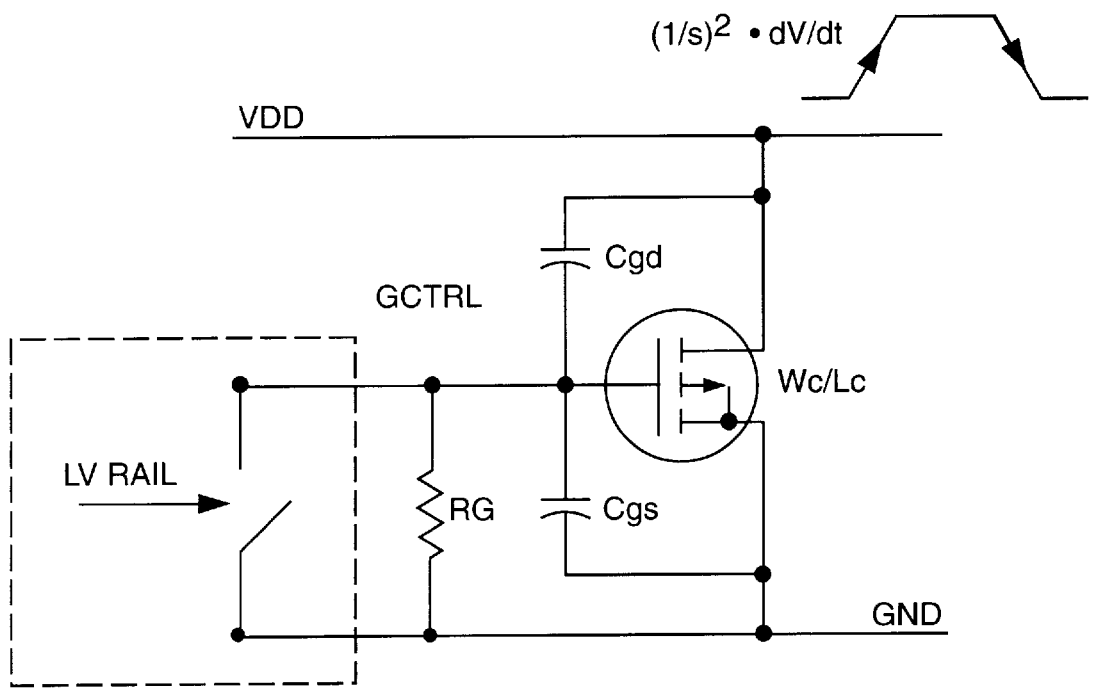
FIG. 2 shows a schematic diagram of a protection circuit according to a preferred embodiment of the present invention.

As shown in FIG. 2, a protection circuit according to an embodiment of the present invention utilizes a field-effect protection transistor GCTRL that is connected between the pulse supply line VDD that is to be protected and ground GND. In the preferred embodiment, the transistors of the protection circuit are of the MOS type. The gate terminal of the protection transistor GCTRL is connected to ground through a first resistor RG and a low voltage supply line-controlled switch that are connected in parallel.

Figure 3:
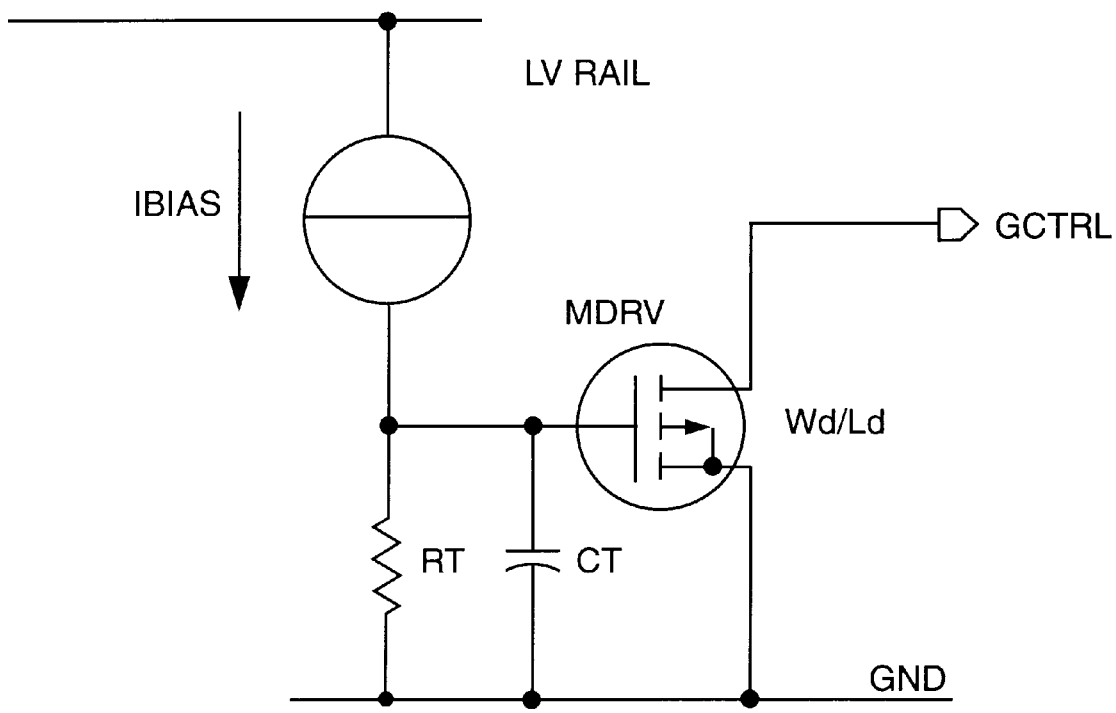
FIG. 3 shows a detailed schematic diagram of one portion of the protection circuit according to the preferred embodiment.

FIG. 3 shows a preferred embodiment of the low voltage supply line-controlled switch. As shown, the switch uses a field-effect switch transistor MDRV that is connected between the gate terminal of the protection transistor GCTRL and ground. The gate terminal of the switch transistor MDRV is connected to the low voltage supply line LV RAIL through a bias current generator IBIAS, and to ground through a second resistor RT and a capacitor CT that are connected in parallel. As explained above, the low voltage supply line LV RAIL itself is regulated and protected against ESD by a dedicated protection circuit.

The operation of the protection circuit of FIGS. 2 and 3 will now be explained. During normal operation, the gate terminal of the switch transistor MDRV is forced to the voltage of the second supply line LV RAIL so the switch transistor MDRV is turned on. Thus, the gate of the active protection transistor GCTRL is grounded so as to disable the protection function. On the other hand, during an ESD event (as may be caused essentially by a power failure), the gate terminal of the switch transistor MDRV is always grounded. Thus, the switch transistor MDRV is turned off and the gate impedance of the active protection circuit of FIG. 2 is controlled by the resistor RG.

The time constant (RT.CT) in the switch portion should be made much higher than the characteristic time constant $tau_{ESD}$ of an electrostatic discharge. This will cause the gate impedance of the switch transistor MDRV to be almost nil during an ESD event. Furthermore, the dimensions of the switch transistor MDRV should be such that:

$$R_{ds} \ll R_G \text{ and } R_{ds} \times C_{dg} \ll \frac{V_T}{(dV/dt)}$$

where RG is the resistance of the resistor RG, $R_{ds}$ is the drain-source resistance of the switch transistor MDRV, and $C_{dg}$ is the drain-gate capacitance of the switch transistor MDRV. This will ensure that the active clamp is never activated during normal operation due to a supply transient $V_T$ with a rate equal to dV/dt (change in voltage over change in time for the transient).

Thus, by suitably choosing the time constant of the switch portion and the dimensions of the switch transistor MDRV, the degree of immunity of the active protection circuit can be greatly enhanced in a pulse supply environment without impairing the efficient operation of the circuit in electrostatic discharge situations.

Figure 1:
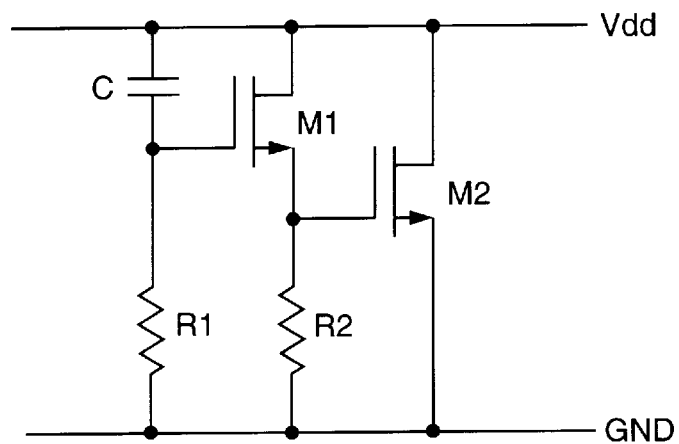
FIG. 1 shows a schematic diagram of a conventional protection circuit.

In another embodiment of the present invention, the switch circuit of FIG. 3 is incorporated into the conventional protection circuit of FIG. 1. More specifically, a second field-effect switch transistor (M2) is added to the switch circuit of FIG. 3 such that the source terminals of both switch transistors are connected together. Further, the drain terminal of the first switch transistor MDRV is connected to the gate terminal of the second switch transistor (M2), and the drain terminal of the second switch transistor (M2) is connected to ground. In this embodiment, the capacitor C is not needed.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A protection circuit for a pulse type power supply line of an integrated circuit device that has a second power supply line for a low DC voltage, said protection circuit comprising:
   a first resistor;
   a first transistor connected between the pulse power supply line and ground, a gate terminal of the first transistor being coupled to ground through the first resistor; and
   a switching circuit having a preset delay,
   wherein the gate terminal of the first transistor is coupled to the second power supply line through the switching circuit, and
   the switching circuit includes a second transistor connected between the gate terminal of the first transistor and ground, a gate terminal of the second transistor being coupled to the second power supply line.

2. The protection circuit as defined in claim 1, wherein gate terminal of the second transistor is coupled to the second power supply line through a current generator.

3. The protection circuit as defined in claim 2, wherein the gate terminal of the second transistor is also coupled to ground through a resistive element and a capacitive element that are connected in parallel.

4. The protection circuit as defined in claim 3,
   wherein the first and second transistors are VDMOS transistors, and
   the second power supply line is a supply line for CMOS circuit components of the integrated circuit device.

5. The protection circuit as defined in claim 1, wherein the first and second transistors are field-effect transistors.

6. The protection circuit as defined in claim 1,
   wherein the first and second transistors are VDMOS transistors, and
   the second power supply line is a supply line for CMOS circuit components of the integrated circuit device.

7. The protection circuit as defined in claim 1, wherein the dimensions of the second transistor are chosen such that:

$$R_{ds} \ll R_G \text{ and } R_{ds} \times C_{dg} \ll \frac{V_T}{(dV/dt)}$$

where RG is resistance of the first resistor, $R_{ds}$ is drain-source resistance of the second transistor, $C_{dg}$ is drain-gate capacitance of the second transistor, $V_T$ is a supply transient during normal operation, and dV/dt is change in voltage over change in time for the supply transient.

8. The protection circuit as defined in claim 7, wherein a time constant for the delay of the switching circuit is substantially higher than the characteristic time constant of an electrostatic discharge.

9. An integrated circuit including a protection circuit for a pulse type power supply line of the integrated circuit, said protection circuit comprising:
   a first resistor;
   a first transistor connected between the pulse power supply line and ground, a gate terminal of the first transistor being coupled to ground through the first resistor; and
   a switching circuit having a preset delay,
   wherein the gate terminal of the first transistor is coupled to a second power supply line for a low DC voltage through the switching circuit, and
   the switching circuit includes a second transistor connected between the gate terminal of the first transistor and ground, a gate terminal of the second transistor being coupled to the second power supply line.

10. The integrated circuit as defined in claim 9, wherein the gate terminal of the second transistor is coupled to the second power supply line through a current generator.

11. The integrated circuit as defined in claim 10, wherein the gate terminal of the second transistor is also coupled to ground through a resistive element and a capacitive element that are connected in parallel.

12. The integrated circuit as defined in claim 11,
   wherein the first and second transistors are VDMOS transistors, and
   the second power supply line is a supply line for CMOS circuit components of the integrated circuit.

13. The integrated circuit as defined in claim 9, wherein the first and second transistors are field-effect transistors.

14. The integrated circuit as defined in claim 9,
   wherein the first and second transistors are VDMOS transistors, and
   the second power supply line is a supply line for CMOS circuit components of the integrated circuit.

15. The integrated circuit as defined in claim 9, wherein the dimensions of the second transistor are chosen such that:

$$R_{ds} \ll R_G \text{ and } R_{ds} \times C_{dg} \ll \frac{V_T}{(dV/dt)}$$

where RG is resistance of the first resistor, Rds is drain-source resistance of the second transistor, Cdg is drain-gate capacitance of the second transistor, VT is a supply transient during normal operation, and dV/dt is change in voltage over change in time for the supply transient.

16. The integrated circuit as defined in claim 15, wherein a time constant for the delay of the switching circuit is substantially higher than the characteristic time constant of an electrostatic discharge.

17. The integrated circuit as defined in claim 9, wherein a time constant for the delay of the switching circuit is substantially higher than the characteristic time constant of an electrostatic discharge.

* * * * *